(12) United States Patent
Zhu et al.

(10) Patent No.: US 11,695,013 B2
(45) Date of Patent: Jul. 4, 2023

(54) CAPACITOR WITH AN ELECTRODE WELL

(71) Applicant: NXP USA, INC., Austin, TX (US)

(72) Inventors: Ronghua Zhu, Chandler, AZ (US); Xin Lin, Phoenix, AZ (US); Todd Roggenbauer, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/452,695

(22) Filed: Oct. 28, 2021

(65) Prior Publication Data

US 2023/0138580 A1 May 4, 2023

(51) Int. Cl.
*H01L 27/12* (2006.01)
*H01L 29/94* (2006.01)
*H01L 27/105* (2023.01)

(52) U.S. Cl.
CPC ........ *H01L 27/1203* (2013.01); *H01L 27/105* (2013.01); *H01L 29/94* (2013.01)

(58) Field of Classification Search
CPC .................. H01L 27/1203; H01L 29/94; H01L 27/10852; H01L 27/01894; H01L 27/105; H01L 27/10814; H01L 27/10888
USPC .................... 257/296, 297; 438/238, 239
See application file for complete search history.

(56) References Cited

U.S. PATENT DOCUMENTS

| | | |
|---|---|---|
| 8,134,222 B2 | 3/2012 | Khan et al. |
| 2013/0009272 A1 | 1/2013 | Sakurai et al. |
| 2013/0140668 A1* | 6/2013 | Botula et al. ....... H01L 21/7662 257/499 |
| 2018/0315864 A1 | 11/2018 | Li et al. |
| 2021/0159308 A1 | 5/2021 | Marzaki |
| 2021/0167009 A1 | 6/2021 | Marzaki |

* cited by examiner

*Primary Examiner* — Thinh T Nguyen
(74) *Attorney, Agent, or Firm* — David G. Dolezal (57) ABSTRACT

A capacitor includes an electrode implemented in an electrode well of a substrate. The electrode well has a net N-type dopant concentration. The capacitor includes an electrode implemented in a conductive structure located above the substrate. The electrodes are separated by a dielectric layer located between the electrodes. A first tub region having a net P-type conductivity dopant concentration is located below and laterally surrounds the electrode well and a second tub region having a net N-type conductivity dopant concentration is located below and laterally surrounds the first tub region and the electrode well.

18 Claims, 7 Drawing Sheets

CAPACITOR WITH AN ELECTRODE WELL

BACKGROUND OF THE INVENTION

Field of the Invention

This invention relates in general to a capacitor with an electrode implemented in a semiconductor well.

Background

Some integrated circuits include capacitors that have one electrode implemented in a semiconductor well of a substrate and the other electrode implemented with a conductive structure located above the well.

Figure 5:
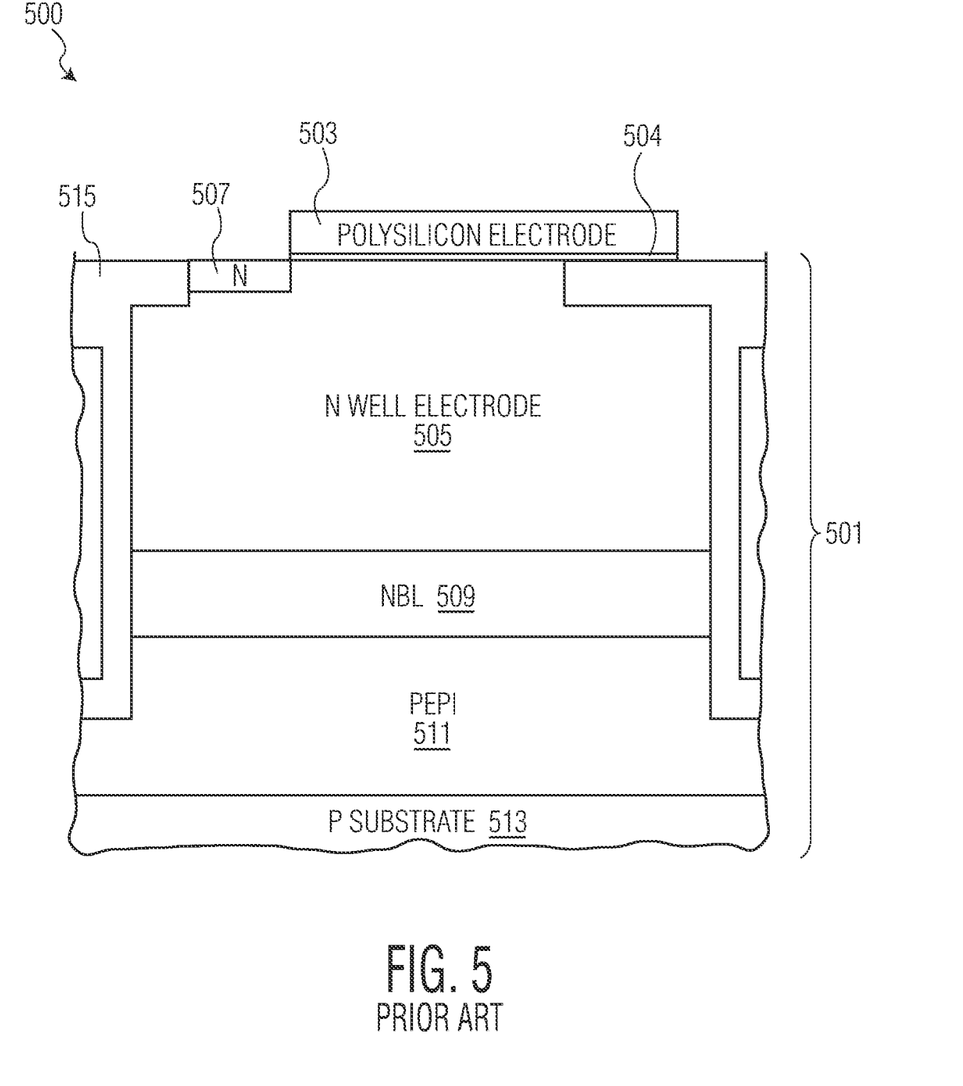
FIG. 5 sets forth a partial cutaway side view of a prior art integrated circuit.

FIG. 5 is a partial cross sectional cutaway side view of a prior art integrated circuit that includes a capacitor 500. Capacitor 500 includes a doped polysilicon electrode 503 located over a substrate 501. The other electrode of capacitor 500 is implemented in an N well 505 located in substrate 501. N well 505 has a net N-type dopant concentration. A dielectric layer 504 separates electrode 503 and well 505 and serves as the dielectric of the capacitor. Well 505 is located over a buried N-type layer 509 (NBL), which is located over a P-type layer (PEPI 511). PEPI 511 has a net P-type dopant concentration and is located in a region of substrate 501 that was epitaxially grown on substrate layer 513. Substrate layer 513 has a net P-type dopant concentration. N well electrode 505 includes a contact region 507 that is biased by a contact (not shown) for biasing N well 505. N well 505 is laterally surrounded by isolation structure 515. In other examples, it may be surrounded by shallow trench isolation structures.

Figure 6:
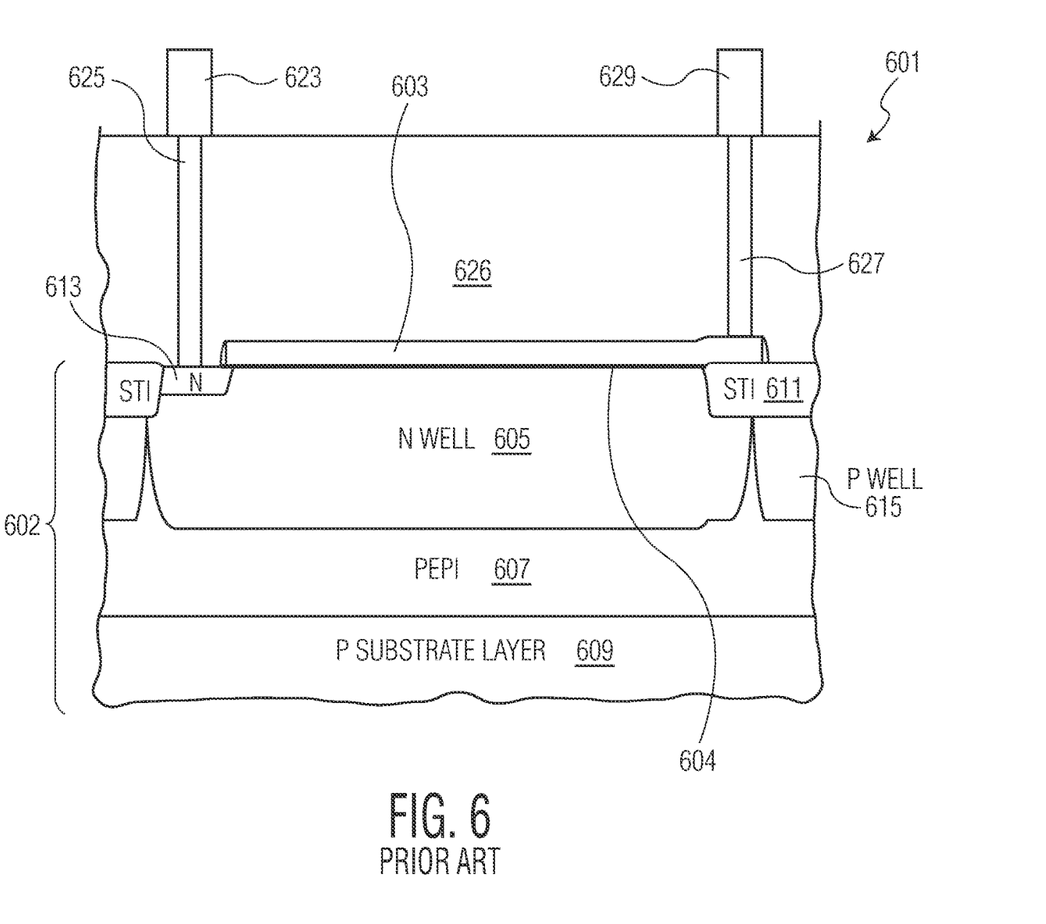
FIG. 6 sets forth a partial cutaway side view of a prior art integrated circuit.

FIG. 6 is a partial cutaway side view of a prior art integrated circuit that includes a capacitor 601 having an N well electrode 605 implemented in a substrate 602 of the integrated circuit. Capacitor 601 includes a doped polysilicon electrode 603 that is separated from electrode 605 by a dielectric layer 604 which serves as the dielectric for the capacitor. N-type well electrode 605 is laterally surrounded by a P-type well 615 and is located over an epitaxial P-type region (PEPI 607). PEPI 607 is epitaxially grown on P-type substrate layer 609. A shallow trench isolation structure (STI 611) laterally surrounds a top portion of N well electrode 605.

As shown in FIG. 6, a dielectric layer structure 626 is located above substrate 602. Dielectric layer structure 626 is made of multiple deposited or grown dielectric layers. A contact 625 is formed to electrically couple a contact region 613 of electrode 605 to interconnect structure 623, which is located in a first metal layer of the integrated circuit. A similar contact 627 couples interconnect structure 629 to electrode 603. In some examples, a buried oxide layer may be located between PEPI 607 and P-type substrate layer 609.

Figure 7:
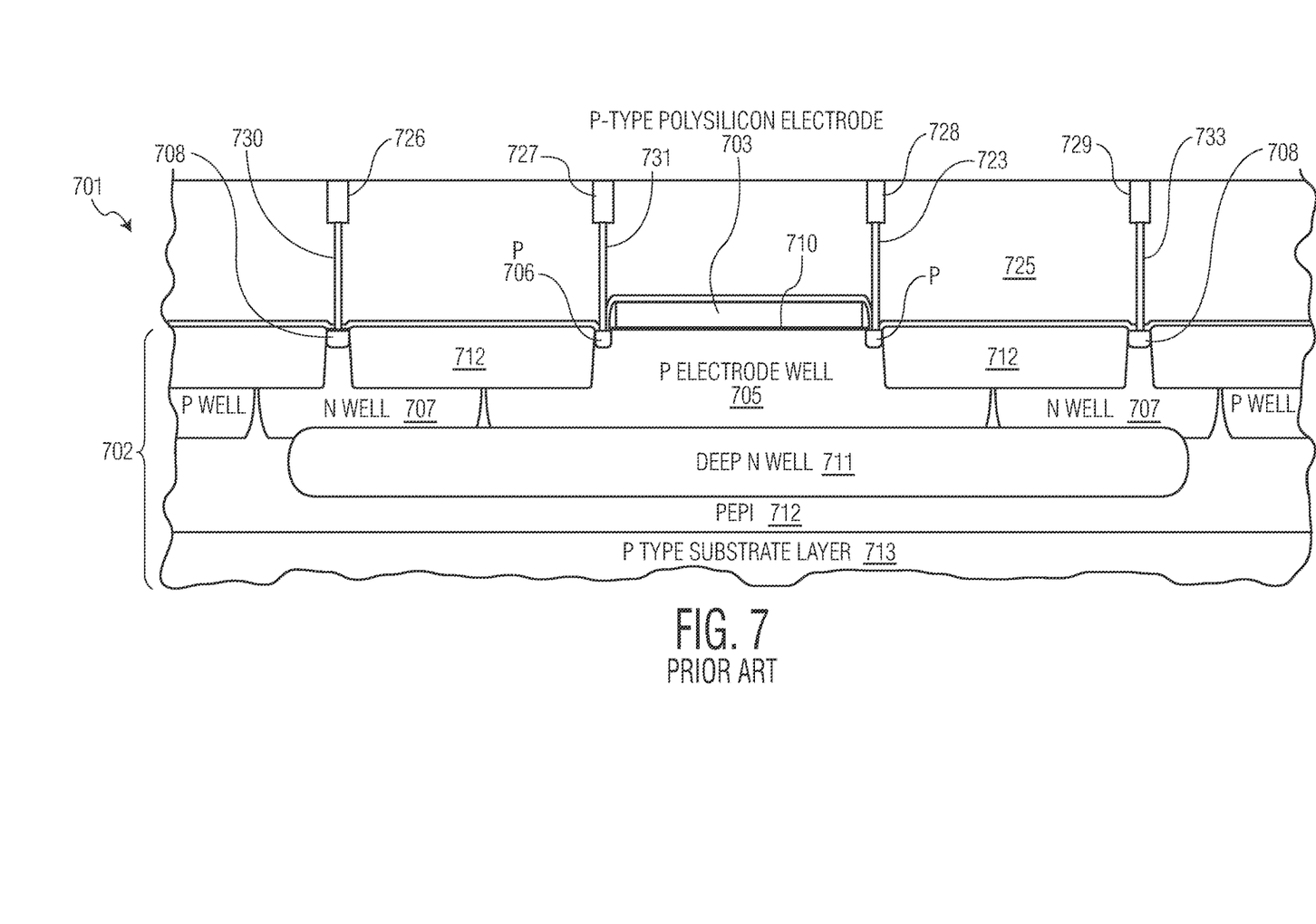
FIG. 7 sets forth a partial cutaway side view of a prior art integrated circuit.

FIG. 7 is a partial cutaway side view of a prior art integrated circuit with a capacitor 701 having a P-type well electrode 705 implemented in a substrate 702 of the integrated circuit. Capacitor 701 includes a P-type doped polysilicon electrode 703 that is separated from electrode 705 by a dielectric layer 710, which serves as the capacitor dielectric. P-type well electrode 705 is laterally surrounded by an N-type well 707 and is located over a deep N-type well 711, which is located over an epitaxial P-type region (PEPI 712). PEPI 712 is epitaxially grown on P-type substrate layer 713. A shallow trench isolation structure 712 laterally surrounds a top portion of N well electrode 605.

As shown in FIG. 7, a dielectric layer structure 725 is located above substrate 702. Dielectric layer structure 725 is made of multiple deposited or grown dielectric layers. Contacts 731 and 723 are formed to electrically coupled a contact region 706 of electrode 705 to interconnect structures 727 and 728 respectively, which are located in the first metal layer of the integrated circuit. Contacts 730 and 733 couple interconnect structures 726 and 729, respectively, to contact region 708 of well 707. A contact for electrode 703 is not shown in FIG. 7.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein, a capacitor includes an electrode implemented in an electrode well of a substrate. The electrode well has a net N-type dopant concentration. The capacitor includes an electrode implemented in a conductive structure located above the substrate. The electrodes are separated by a dielectric layer located between the electrodes. A first tub region having a net P-type conductivity dopant concentration is located below and laterally surrounds the electrode well and a second tub region having a net N-type conductivity dopant concentration is located below and laterally surrounds the first tub region and the electrode well. In some embodiments, providing a second tub region having a net N-type dopant concentration that is located below and laterally surrounds the first tub region and is located below and laterally surrounds the electrode well, may provide for a mechanism to divert noise current from the substrate away from the capacitor that could otherwise affect a circuit implementing the capacitor.

Figure 1:
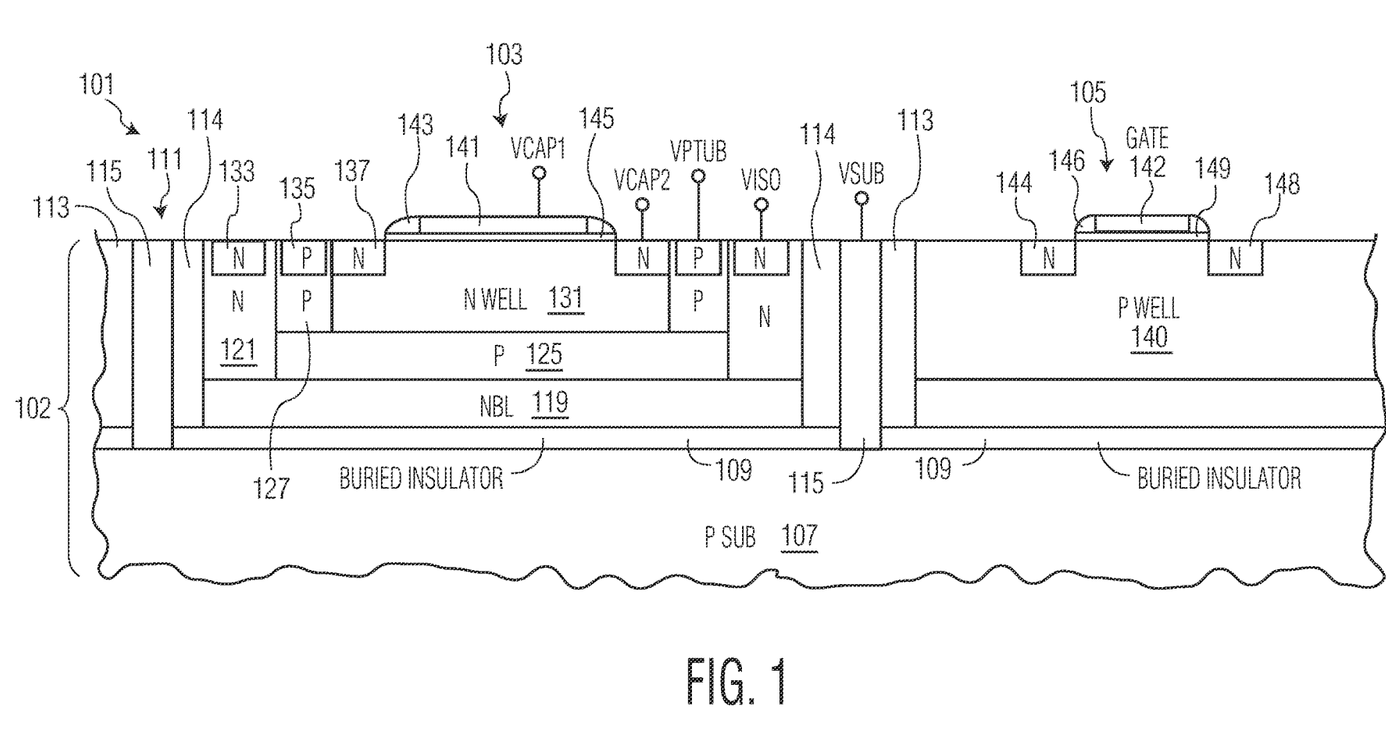
FIG. 1 sets forth a partial cutaway side view of an integrated circuit at one stage in its manufacture according to one embodiment of the present invention.

FIG. 1 is a partial cutaway side view of an integrated circuit at one stage of its manufacture according to one embodiment of the present invention. Integrated circuit 101 is shown as including a capacitor 103 and a NFET 105. Capacitor 103 and NFET 105 include structures located in a semiconductor substrate 102. In the embodiment shown, semiconductor substrate 102 has a semiconductor on insulator (SOI) configuration with a semiconductor material located above a buried insulator 109. In the embodiment shown, insulator 109 is located above a substrate layer (P SUB 107), which in the embodiment shown has a net P-type dopant concentration. In one embodiment layer 107 is made of monocrystalline silicon, but may be made of another semiconductor material. In one embodiment, buried insulator 109 is an oxide layer having a thickness in the range of 0.2 to 2 um, but may be of other thicknesses and/or made of other dielectric materials in other embodiments.

Capacitor 103 includes an electrode implemented as a well 131 of semiconductor material located in substrate 102. Well 131 has a net N-type conductivity dopant concentration. In one embodiment, well 131 is located in a layer of monocrystalline silicon on top of buried insulator 109, but may be located in other types of semiconductor material (e.g. SiGe, silicon carbon) in other embodiments. In the embodiment shown, well 131 has a contact region 137 located at an upper portion that has a higher net N-type dopant concentration. Contact region 137 will subsequently be silicided where contacts (e.g. similar to contact 625 of FIG. 6) will be formed to contact the silicide of region 137 for biasing the electrode well 131 (as represented by the voltage VCP2) during operation.

The other electrode of capacitor 103 is implemented as a doped polysilicon structure 141. In one embodiment, structure 141 is doped with an N-type doping. In other embodiments, structure 141 may be made of a metal (e.g. tungsten, copper, titanium, titanium nitride). Structure 141 is laterally surrounded by sidewall spacer 143. A dielectric layer 145 is located between well 131 and structure 141 and serves as the dielectric for capacitor 103. Dielectric layer 145 can be made of an oxide, a high-k metal oxide, or other dielectric material. In some embodiments, layer 145 may be a composite layer of different dielectric materials.

Substrate 102 includes a tub region of semiconductor material with a net P-type conductivity dopant concentration that laterally surrounds and is located underneath electrode well 131. In the embodiment shown, the P-type tub region includes a bottom portion 125 located underneath well 131 and includes a sinker side region 127 that laterally surrounds well 131. Region 127 extends to bottom portion 125. In some embodiments, region 127 and portion 125 have the same net P-type dopant concentration, but may have different net concentrations in other embodiments. Sinker region 127 includes a contact region 135 located at an upper portion where a subsequently formed contact (e.g. similar to contact 625 of FIG. 6) contacts a silicided portion (not shown) of region 127 for biasing the P-type tub region (shown in FIG. 1 as voltage VPTUB).

Substrate 102 includes a tub region of semiconductor material with a net N-type conductivity dopant concentration that laterally surrounds and is located underneath electrode well 131 and the P-type tub region. In the embodiment shown, the N-type tub region includes a bottom portion 119 (NBL 119) located underneath well 131 and bottom portion 125 and includes a sinker side region 121 that laterally surrounds well 131 and sinker region 127. Region 121 extends to bottom portion 119. In some embodiments, region 121 and portion 119 have the same net N-type dopant concentration, but may have different net N-type concentrations in other embodiments. Sinker region 121 includes a contact region 133 located at an upper portion where a subsequently formed contact (e.g. similar to contact 625 of FIG. 6) contacts a silicided portion (not shown) of region 133 for biasing the N-type tub region (shown in FIG. 1 as voltage VISO).

In the embodiment of FIG. 1, an isolation structure 111 laterally surrounds well 131, the P-type tub region, and the N-type tub region. In the embodiment shown, isolation structure 111 includes an inner dielectric wall 114 that extends from the upper surface of substrate 102 to the buried insulator 109, a conductive structure 115 which is used to bias substrate layer 107 at a voltage (VSUB), and an outer dielectric wall 113 which extends from the upper surface of substrate 102 to the buried insulator 109. Wall 114 and buried insulator 109 form a dielectric tub that lateral surrounds and is located beneath well 131. In some embodiments, conductive structure 115 is made of polysilicon and is doped with at P-type conductivity dopant (e.g. Boron). Some embodiments do not include insolation structure 111.

Also located on integrated circuit 101 are other semiconductor devices such as NFET 105. NFET 105 includes a gate 142, an N-type source region 144, and an N-type drain region 148. When conductive, a channel region forms in P Well 140 between source region 144 and drain region 148 under gate 142. A sidewall spacer 146 surrounds gate 142. Integrated circuit 101 may include other types of semiconductor devices such as PFETs, other types of transistors, and diodes.

In one embodiment, gate 142 is made of the same material and at the same time as electrode structure 141, spacer 146 is made of the same material and at the same time as spacer 143, and gate dielectric 149 is formed from the same material and at the same time as dielectric layer 145. Also, source region 144 and drain region 148 are formed from the same ion implantation operations used to form contact regions 133 and 137. In other embodiments, the structures of NFET 105 may be formed of different materials and at different times from the structures of capacitor 103.

Figure 2:
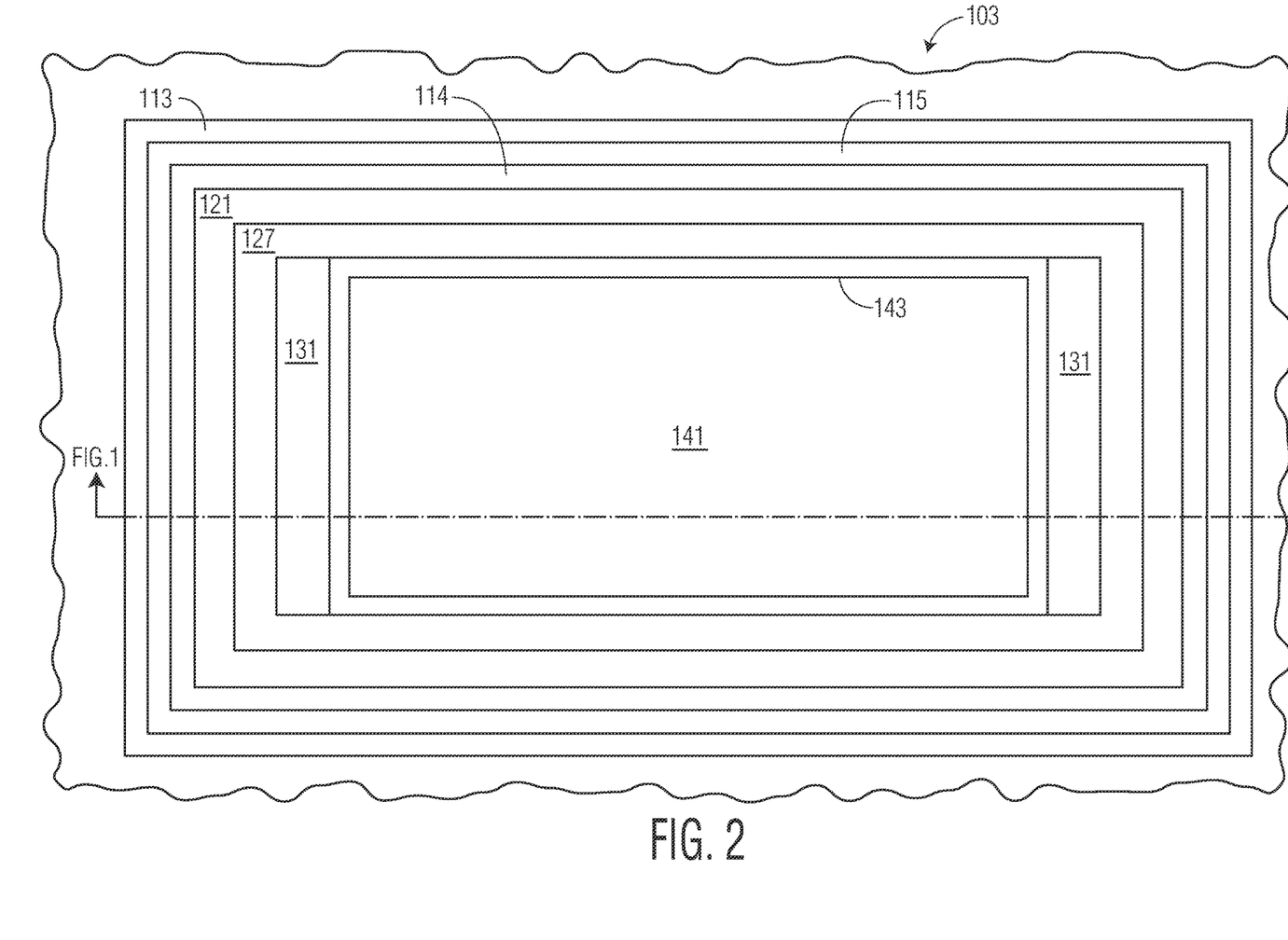
FIG. 2 is a partial top view of a capacitor of FIG. 1 according to one embodiment of the present invention.

FIG. 2 is a top view of the portion of integrated circuit 101 showing capacitor 103 at the stage of manufacture of FIG. 1. NFET 105 is not shown in the view of FIG. 2. As shown in FIG. 2, region 127 laterally surrounds electrode well 131, region 121 laterally surrounds region 127, dielectric wall 114 laterally surrounds region 121, conductive structure 115 laterally surrounds dielectric wall 114, and outer dielectric wall 113 laterally surrounds conductive structure 115. Note that only the side portions, relative to the view shown in FIG. 2, of well 131 are not covered by electrode structure 141 and sidewall spacer 143. In some embodiments, sidewall spacer 143 would extend over portions of region 127 in the vertical direction, relative to the view of FIG. 2. Not shown in FIG. 2 are contact region 137 in well 131, contact region 135 in region 127, and contact region 133 in region 121.

In FIG. 2, the regions, wells, and other structures are shown as having a rectangle shape, but may have other shapes in other embodiments.

Referring back to FIG. 1, capacitor 103 may be formed by a number of different methods. In one method, substrate 102 is part of a wafer that initially has a lower thickness of semiconductor material above insulator 109, where the top of the substrate is initially at the location of the top of NBL 119 as shown in FIG. 1. At such a stage, NBL 119 is formed by selectively implanting N-type dopants (e.g. antimony, arsenic or phosphorous) in substrate 102 at a relatively heavy dosages in the range of 2e14 to $2e15/cm^2$ and at an energy in the range of 50 to 150 KeV, but may be implanted at other dosages and other energies in other embodiments. Afterward, semiconductor material (e.g. monocrystalline silicon, SiGe) is epitaxially grown on the top surface of substrate 102 to increase the thickness of substrate 102 to its thickness shown in FIG. 1. N sinker region 121 is then formed by selectively implanting N-type dopants in substrate 102 at a relatively heavy dosage in the range of 5e13 to 5e14/cm$^2$ and at an energy in the range of 1-2 MeV, but may be implanted at other dosages and other energies in other embodiments. In some embodiments, NBL 119 is more heavily doped than region 121. However, in other embodiments, they may have the same dopant concentration.

Bottom portion 125 is formed by selectively implanting P-type dopants (e.g. Boron) in substrate 102 at a dosage in the range of 5e12 to 5e13/cm$^2$ and at an energy in the range of 500 KeV to 1.5 MeV, although in other embodiments, they may be implanted at other dosages and other energies. P-type sinker region 127 is formed by selectively implanting P-type dopants (Boron) in substrate 102 at a dosage in the range of 1E13 to 1E14/cm$^2$ and at an energy in the range of 200 KeV to 1 MeV, although other embodiments, they may be implanted at other dosages and other energies.

N well 131 is formed by selectively implanting N-type dopants in substrate 102 at a dosage in the range of 1E13 to 1E14/cm$^2$ and at an energy in the range of 100 KeV to 1 MeV, although in other embodiments, they may be implanted at other dosages and other energies. In some embodiments, well 131 has a lower net N-type dopant concentration than NBL 119. However, in other embodiments, they would have the same or higher net doping concentration.

In one embodiment, insulator structure 115 is formed in substrate 102 by forming an opening in substrate 102 to expose buried insulator 109. The opening is then filled with a dielectric (e.g. oxide) and the wafer is planarized. A second more narrower opening is then formed in the deposited and planarized dielectric that exposes substrate layer 107 and defines a side of wall 113 and a side of wall 114. The second opening is filled with doped polysilicon and planarized to form structure 115.

Afterwards, a layer of dielectric material is formed on substrate 102 followed by a layer of polysilicon. The layer of polysilicon is patterned to form electrode structure 141 (and gate 142). Spacer 143 (and spacer 146) are then formed of a dielectric spacer material (e.g. oxide, nitride). During the formation of the spacers, the layer of dielectric material is etched to define dielectric layer 145 (and gate dielectric 149).

After the formation of electrode structure 141, N-type contact regions 133, and 137 (as well as source region 144 and drain region 148) are formed by selectively implanting N-type dopants in substrate 102 at a dosage in the range of 1e14 to 7e15/cm$^2$ and at an energy in the range of 20 to 50 KeV, although in other embodiments, they may be implanted at other dosages and other energies. At the same time, electrode structure 141 and gate 142 may be implanted with the same N-type dopants. Contact region 135 is formed by selectively implanting P-type dopants in substrate 102 at a dosage in the range of 1 to 5 E15/cm$^2$ and at an energy in the range of 3 to 10 KeV, although in other embodiments, they may be implanted at other dosages and other energies. In some embodiments, at least some of the implant processes described above may be performed by multiple chain implant processes.

After the stage shown in FIG. 1, the top portions of conductive structure 115, contact regions 133, 135, 137, electrode structure 141 (and source region 144, drain region 148, and gate 142) are silicided with a silicide metal. One or more dielectric layers are formed over substrate (similar to dielectric layer structure 626 of FIG. 6 or dielectric structure 725 of FIG. 7). Openings are then formed in the dielectric layer structure and contacts are formed to contact the silicided portions of structure 115, regions 133, 135, and 137, electrode 151 (as well as source region 144, drain region 148, and gate 142) which are similar to contacts 625 and 627 of FIG. 6. Interconnect structures (similar to interconnect structures 623 and 629 of FIG. 6 or interconnect structures 726-729 of FIG. 7) are formed in one or more metal layers to interconnect the contacts to each other and to external conductive terminals (e.g. bond pads, bond posts, bumps) formed on the top surface of a wafer during fabrication. Afterwards, the wafer is separated into multiple integrated circuits, each including a capacitor similar to capacitor 103. The integrated circuits may be packaged into integrated circuit packages that are implemented in electronic systems. The method for forming an integrated circuit may include other conventional processes not described herein such as e.g. cleaning, annealing, and passivation operations.

A capacitor as describe herein may be made according to other methods. For example, region 127 and portion 125 may be formed by one implantation step to form a P well where N well 131 is formed by implanting N-type dopants into a portion of the P well at a higher concentration to provide a net N dopant region. Also, the capacitor may include other structures in other embodiments.

During the operation of capacitor 103, the N-type tub region (NBL 119, region 121) is biased at a voltage (VISO) that is equal to or higher than a voltage (VPTUB) that biases the P-type tub region so as to prevent forward biasing of the diode formed between the N-type tub region and the P-type tub region. Also during operation, well 131 is biased at a voltage (VCAP2) that is greater than or equal to the voltage VPTUB that biases the P-type tub region so as to prevent forward biasing of the diode formed between electrode well 131 and the P-type tub region. In one embodiment, VISO and VSUB are biased at 0V and VPTUB is biased at −0.5V. However, these voltages may be of other values in other embodiments.

Figure 3:
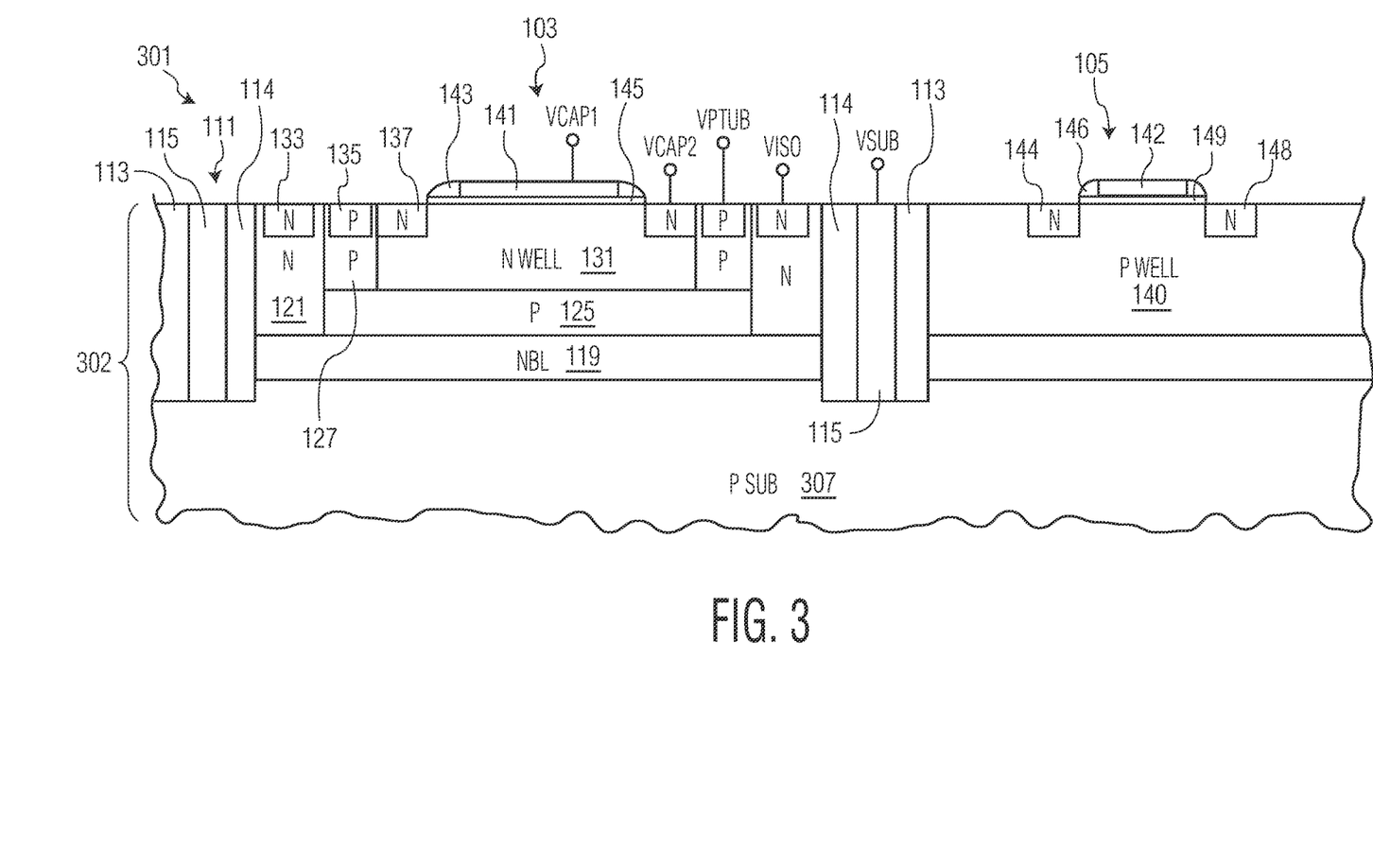
FIG. 3 sets forth a partial cutaway side view of an integrated circuit at one stage in its manufacture according to another embodiment of the present invention.

FIG. 3 shows partial cross sectional view of an integrated circuit 301 according to another embodiment of the present invention. Structures in FIG. 3 having the same reference numbers as the structures in FIG. 1 are similar. The main difference between the embodiment of FIG. 1 and the embodiment of FIG. 3 is that the substrate 302 of the embodiment of FIG. 3 has a bulk semiconductor configuration (e.g. bulk monocrystalline silicon) instead of the SOI configuration of FIG. 1. With substrate 302 there is no underlying buried insulator (similar to buried insulator 109 of FIG. 1).

In other embodiments, an integrated circuit having a capacitor may not include a deep trench isolation structure (e.g. 111) surrounding the capacitor. For example, in some embodiments, a capacitor may be surrounded by a shallow trench isolation structure (e.g. similar to STI 611 in FIG. 6 or STI 712 in FIG. 7). In other embodiments, an integrated circuit and capacitor may have other configurations, have other structures, and/or be formed by other methods.

Figure 4:
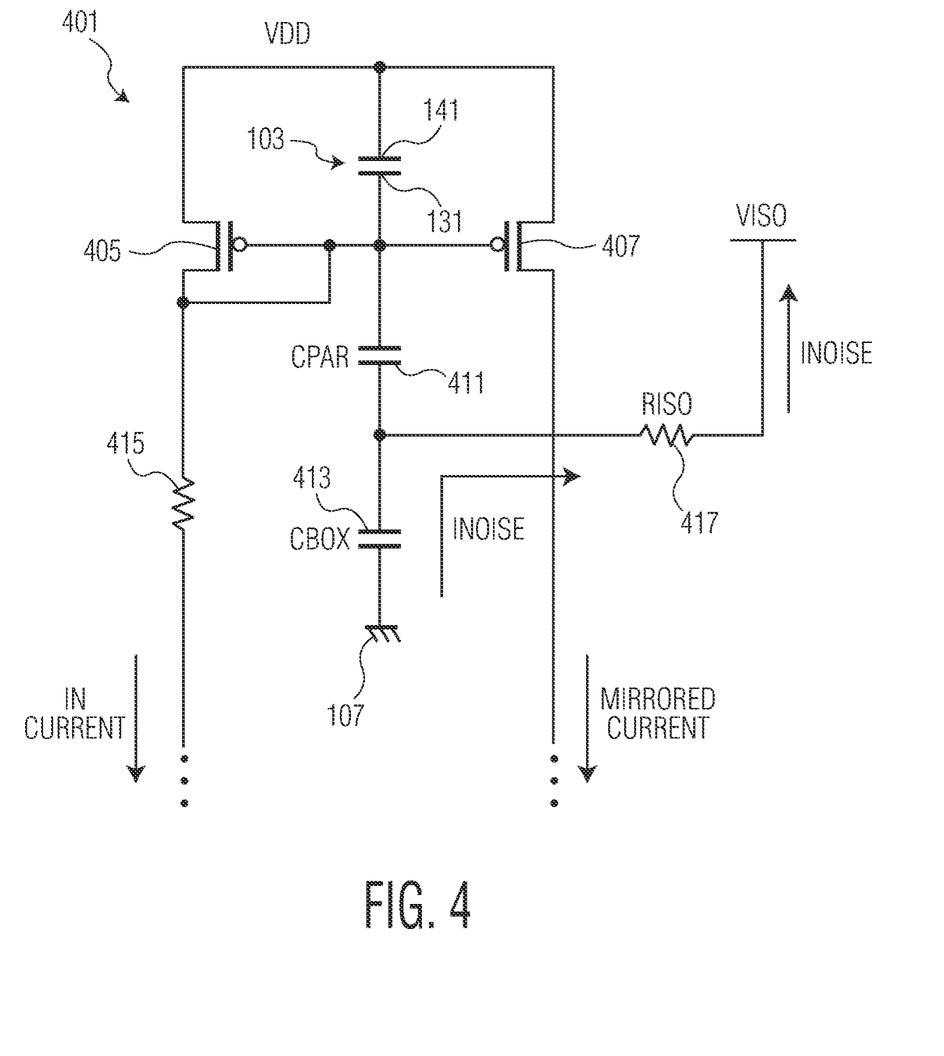
FIG. 4 sets forth a circuit diagram of a current mirror according to one embodiment of the present invention.

FIG. 4 is a circuit diagram of a current mirror circuit 401 which utilizes capacitor 103 as a noise filter. In the embodiment shown, current mirror circuit 401 includes two PFETs 405 and 407 in a current mirror configuration where the gate of PFET 405 is connected to the gate of PFET 407 and connected to the well electrode (e.g. electrode well 131) of capacitor 103. In some embodiments, either PFET 405 or PFET 407 may be implemented on the same integrated circuit as capacitor 103. Located in an input current path is resistor 415. Current mirror circuit 401 provides a mirrored output current (MIRRORED CURRENT) that is the same, a multiple, or a fraction of the input current (IN CURRENT).

Also shown in FIG. 4 are parasitic capacitors CPAR 411 and CBOX 413 that are associated with capacitor 103 of FIG. 1. CPAR 411 represents the parasitic capacitance between NBL 119 and electrode well 131. CBOX 413 represents the capacitance between NBL 119 and substrate layer 107 where buried insulator 109 is the dielectric for capacitance CBOX 413. Resistor RISO 417 represents the resistance of the N-type tub region to the bias voltage source of VISO.

During operation, capacitor 103 acts as a filter to filter out noise in the input signal IN CURRENT such that the output MIRRORED CURRENT is relatively noise free. However, utilizing a capacitor with a well electrode may introduce noise current (INOISE) from other devices (e.g. NFET 105) of the integrated circuit through substrate layer 107. In the embodiment shown, the N-type tub region (NBL 119 and sinker region 121) acts with capacitor CBOX 413 to provide a filter than filters out the noise current from the substrate and provides for an alternative path to divert the noise current (INOISE) from substrate layer 107 to the VISO bias source and away from electrode well 131. By diverting the noise current away from electrode well 131, the noise current (INOISE) will not affect (or only minimally affect) the output MIRRORED CURRENT.

In some embodiments, the cutoff frequency (fc) of the filter of CBOX 413 and RISO 417 is fc=½(2πRISO*CBOX). Accordingly, the cutoff frequency of the filter can be adjusted by varying the N-type doping concentrations of NBL 119 and sinker region 121.

In other embodiments, a capacitor with an N-type electrode well that is isolated with both a P-type tub and an N-type tub can be used in other types of circuits (e.g. a filter, A/D converter, memory, I/O, digital logic, power supply etc.) In some embodiments, the electrode well (131) would be connected the power supply terminal (VDD, VSS) and the conductive structure electrode (141) would be connected to other devices.

As disclosed herein, a first structure is "directly over" or "directly above" a second structure if the first structure is located over the second structure in a line having a direction that is perpendicular with the generally planar major side of a wafer or substrate. For example, in FIG. 1, electrode structure 141 is directly over electrode well 131. Source region 144 is not directly over NBL 119. As disclosed herein, a first structure is "directly beneath" or "directly below" a second structure if the first structure is located beneath the second structure in a line having a direction that is perpendicular with the generally planar major side of the wafer or substrate. For example, in FIG. 1, NBL 119 is directly beneath electrode structure 141. NBL 119 is not directly beneath gate 142. One structure is "directly between" two other structures in a line if the two structures are located on opposite sides of the one structure in the line. For example, in FIG. 1, structure 115 is located directly between well 131 and P well 140 in a line in the cut away side view of FIG. 1. "Directly laterally between" means that the line is a lateral line. A "lateral line" is a line that is parallel with a generally planar major side of the wafer or substrate. In FIG. 1, regions 121 and 127 are located in a lateral line. Region 127 and NBL 119 are not located in a lateral line. As disclosed herein, a first structure is directly laterally surrounding a second structure if a portion of the first structure surrounds the second structure in a plane that is parallel with a generally planar major side of the wafer or substrate (a lateral plane). For example, in FIG. 1, structure 115 directly laterally surrounds bottom portion 125. Sinker region 121 does not directly laterally surround electrode structure 141. As disclosed herein, a first structure is "laterally separated" from a second structure if there is separation between the two structures in a line that is parallel with a generally planar major side of the wafer or substrate. For example, in FIG. 1, walls 114 and 113 are laterally separated from each other. As disclosed herein, a "lateral distance" is the distance in a direction that is parallel with a generally planar major side of the wafer or substrate. As disclosed herein, a "vertical distance" is the distance in a direction that is perpendicular with a generally planar major side of the wafer or substrate.

Features shown or described herein with respect to one embodiment may be implemented in other embodiments shown or described herein. For example, the capacitor of FIG. 3 may be implemented in the circuit of FIG. 4.

In one embodiment, an integrated circuit includes a substrate including semiconductor material. The substrate includes an electrode well of semiconductor material having a net N-type dopant concentration. The electrode well serves as a first electrode for a capacitor. The substrate includes a first tub region of semiconductor material having a net P-type dopant concentration. The first tub region including a bottom portion located directly below the electrode well and side portions directly laterally surrounding the electrode well. The substrate includes a second tub region of semiconductor material having a net N-type dopant concentration. The second tub region including a bottom portion located directly below the electrode well and directly below the bottom portion of the first tub region and side portions directly laterally surrounding the electrode well and directly laterally surrounding the side portions of the first tub region. The substrate includes a structure. The structure is of a material that is other than a semiconductor material having a net N-type dopant concentration. The bottom portion of the second tub region is located directly over the structure. The integrated circuit includes a dielectric layer located directly over the electrode well. The dielectric layer serves as a dielectric for the capacitor. The integrated circuit includes a conductive electrode structure located directly over the dielectric layer and directly over the electrode well. The conductive electrode structure serves as a second electrode for the capacitor.

In another embodiment, an integrated circuit includes a substrate including semiconductor material. The substrate includes an electrode well of semiconductor material having a net N-type dopant concentration. The electrode well serves as a first electrode for a capacitor. The substrate includes a first tub region of semiconductor material having a net P-type dopant concentration. The first tub region including a bottom portion located directly below the electrode well and side portions directly laterally surrounding the electrode well. The substrate includes a second tub region of semiconductor material having a net N-type dopant concentration. The second tub region includes a bottom portion located directly below the bottom portion of the first tub region and side portions directly laterally surrounding the side portions of the first tub region. The substrate includes a structure. The structure is of a material that is other than a semiconductor material having a net N-type dopant concentration. The bottom portion of the second tub region is located directly over the structure. The integrated circuit includes a dielectric layer located directly over the electrode well. The dielectric layer serves as a dielectric for the capacitor. The integrated circuit includes a conductive electrode structure located directly over the dielectric layer and directly over the electrode well. The conductive electrode structure serves as a second electrode for the capacitor.

In another embodiment, an integrated circuit includes a capacitor. The capacitor includes a first electrode implemented in an electrode well of semiconductor material having a net N-type dopant concentration, a dielectric layer located directly over the electrode well, and a second electrode implemented with a conductive electrode structure located directly over the dielectric layer and directly over the electrode well. The integrated circuit includes a first tub region of semiconductor material having a net P-type dopant concentration. The first tub region including a bottom portion located directly below the electrode well and side portions directly laterally surrounding the electrode well. The integrated circuit includes a second tub region of semiconductor material having a net N-type dopant concentration. The second tub region including a bottom portion located directly below the electrode well and directly below the bottom portion of the first tub region and side portions directly laterally surrounding the electrode well and directly laterally surrounding the side portions of the first tub region. The integrated circuit includes a structure. The structure is of a material that is other than a semiconductor material having a net N-type dopant concentration. The bottom portion of the second tub region is located directly over the structure.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit comprising:
    a substrate including semiconductor material, the substrate including:
        an electrode well of semiconductor material having a net N-type dopant concentration, the electrode well serving as a first electrode for a capacitor;
        a first tub region of semiconductor material having a net P-type dopant concentration, the first tub region including a bottom portion located directly below the electrode well and side portions directly laterally surrounding the electrode well;
        a second tub region of semiconductor material having a net N-type dopant concentration, the second tub region including a bottom portion located directly below the electrode well and directly below the bottom portion of the first tub region and side portions directly laterally surrounding the electrode well and directly laterally surrounding the side portions of the first tub region;
        a structure, the structure is of a material that is other than a semiconductor material having a net N-type dopant concentration, the bottom portion of the second tub region is located directly over the structure;
    a dielectric layer located directly over the electrode well, the dielectric layer serves as a dielectric for the capacitor;
    a conductive electrode structure located directly over the dielectric layer and directly over the electrode well, the conductive electrode structure serves as a second electrode for the capacitor.

2. The integrated circuit of claim 1 wherein the structure is characterized as a buried insulator in the substrate.

3. The integrated circuit of claim 1 wherein the structure is characterized as semiconductor material with a net P-type dopant concentration.

4. The integrated circuit of claim 1 wherein the substrate further includes a trench isolation structure directly laterally surrounding the electrode well, the side portions of the first tub region, and the side portions of the second tub region.

5. The integrated circuit of claim 4 wherein the trench isolation structure includes a dielectric material directly laterally surrounded by an isolation conductive structure.

6. The integrated circuit of claim 5 wherein the structure is characterized as a buried insulator in the substrate, the buried insulator is located over a substrate layer of semiconductor material, the isolation conductive structure of the trench isolation structure is electrically connected to the substrate layer.

7. The integrated circuit of claim 6 wherein the substrate layer has a net P-type dopant concentration.

8. The integrated circuit of claim 4 wherein the structure is characterized as a buried insulator in the substrate, the buried insulator is located over a substrate layer of semiconductor material, the trench isolation structure includes a dielectric material that contacts the buried insulator to form a tub of dielectric material.

9. The integrated circuit of claim 1 wherein the conductive electrode structure includes a doped polysilicon material.

10. The integrated circuit of claim 1 wherein the conductive electrode structure includes a metal material.

11. The integrated circuit of claim 1 wherein:
    the first tub region includes a contact region located at an upper surface of a side portion of the first tub region for biasing the first tub region;
    the second tub region includes a contact region located at an upper surface of a side portion of the second tub region for biasing the second tub region.

12. The integrated circuit of claim 11 wherein the first tub region is configured to be biased at a lower voltage than the second tub region during operation.

13. The integrated circuit of claim 1 wherein:
    the substrate includes a substrate layer of semiconductor material directly below the bottom portion of the second tub region;
    during operation, the second tub region provides a path for diverting noise current from the substrate layer away from the electrode well.

14. The integrated circuit of claim 13 wherein:
    the structure is characterized as a buried insulator in the substrate;
    the substrate layer of semiconductor material is directly below the buried insulator.

15. The integrated circuit of claim 14 wherein the integrated circuit implements a noise filter for noise current from the substrate layer, wherein a cut off frequency of the noise filter is dependent on a resistance of a current path of the second tub region and a capacitance between a second tub region and the substrate layer.

16. The integrated circuit of claim 1 further comprising:
    a first transistor including a control terminal;
    a second transistor coupled in a current mirror configuration with the first transistor, the second transistor including a control terminal;
    wherein an electrode of the capacitor is coupled to the control terminal of the first transistor and the control terminal of the second transistor.

17. The integrated circuit of claim 16 wherein the electrode of the capacitor is the electrode well.

18. The integrated circuit of claim 1 wherein the bottom portion of the second tub region has a higher net N-type dopant concentration than the electrode well.

\* \* \* \* \*